United States Patent
Wu et al.

(10) Patent No.: US 12,153,114 B2
(45) Date of Patent: Nov. 26, 2024

(54) 3D OSCILLATING GRADIENT-PREPARED GRADIENT SPIN-ECHO IMAGING METHOD, AND DEVICE

(71) Applicant: ZHEJIANG UNIVERSITY, Zhejiang (CN)

(72) Inventors: Dan Wu, Hangzhou (CN); Haotian Li, Hangzhou (CN); Yi Zhang, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 6 days.

(21) Appl. No.: 17/952,341

(22) Filed: Sep. 26, 2022

(65) Prior Publication Data

US 2023/0125982 A1    Apr. 27, 2023

Related U.S. Application Data

(63) Continuation of application No. PCT/CN2021/074841, filed on Feb. 2, 2021.

(30) Foreign Application Priority Data

Mar. 31, 2020   (CN) .......................... 202010243339.X

(51) Int. Cl.
   *G01R 33/561*    (2006.01)
   *G01R 33/48*     (2006.01)
   (Continued)

(52) U.S. Cl.
   CPC ..... *G01R 33/5618* (2013.01); *G01R 33/4826* (2013.01); *G01R 33/4835* (2013.01);
   (Continued)

(58) Field of Classification Search
   CPC ............ G01R 33/5618; G01R 33/4826; G01R 33/4835; G01R 33/5611; G01R 33/5616;
   (Continued)

(56) References Cited

U.S. PATENT DOCUMENTS

| 5,245,282 A | 9/1993 | Mugler, III et al. |
| 6,320,380 B1 | 11/2001 | Wu et al. |

(Continued)

FOREIGN PATENT DOCUMENTS

| CN | 105283774 A | 1/2016 |
| CN | 106344015 A | 1/2017 |

(Continued)

OTHER PUBLICATIONS

Chen, Nan-kuei, et al. "A robust multi-shot scan strategy for high-resolution diffusion weighted MRI enabled by multiplexed sensitivity-encoding (MUSE)." Neuroimage 72 (2013): 41-47. (Year: 2013).*

(Continued)

*Primary Examiner* — Rishi R Patel
(74) *Attorney, Agent, or Firm* — W&G Law Group

(57) ABSTRACT

A method for 3D oscillating-gradient prepared gradient spin-echo imaging and a device. The imaging method comprises the following steps: first, using a global saturation module to destroy previous residual transverse magnetization; second, embedding a pair of trapezoidal cosine oscillating gradients into a $90°_x$-$180°_y$-$90°_{-x}$ radiofrequency pulse by a diffusion encoding module, to separate diffusion encoding from signal acquisition; then, using a fat saturation module to suppress a fat signal; finally, acquiring a signal by means of gradient spin-echo readout, and correcting phase errors among multiple excitations by multiplexed sensitivity-encoding reconstruction. Compared with a 2D plane echo-based oscillating gradient diffusion sequence used on a 3T clinical system, a 3D oscillating-gradient prepared gradient spin-echo sequence effectively reduces the imaging time, improves the signal to noise ratio, and is beneficial to clinical transformation of time-dependent diffusion MRI technology.

6 Claims, 2 Drawing Sheets

(51) Int. Cl.
    *G01R 33/483*     (2006.01)
    *G01R 33/563*     (2006.01)

(52) U.S. Cl.
    CPC ...... *G01R 33/5611* (2013.01); *G01R 33/5616* (2013.01); *G01R 33/56341* (2013.01)

(58) Field of Classification Search
    CPC .......... G01R 33/56341; G01R 33/5615; G01R 33/5619; G01R 33/5607
    See application file for complete search history.

(56) References Cited

U.S. PATENT DOCUMENTS

| | | | | |
|---|---|---|---|---|
| 2009/0212773 | A1* | 8/2009 | Feinberg | G01R 33/4818 324/309 |
| 2012/0194193 | A1* | 8/2012 | Rehwald | G01R 33/4828 324/318 |
| 2015/0272453 | A1 | 10/2015 | Heberlein et al. | |
| 2017/0293008 | A1* | 10/2017 | Qin | G01R 33/50 |
| 2019/0137588 | A1* | 5/2019 | Girard | G01R 33/5607 |
| 2021/0228096 | A1* | 7/2021 | Qin | G01R 33/5607 |

FOREIGN PATENT DOCUMENTS

| | | | |
|---|---|---|---|
| CN | 107548464 | A | 1/2018 |
| CN | 108720834 | A | 11/2018 |
| CN | 109115820 | A | 1/2019 |
| CN | 111352054 | A | 6/2020 |

OTHER PUBLICATIONS

"Spectral Presaturation with Inversion Recovery (SPIR)". Questions and Answers in MRI. <https://mriquestions.com/spir.html>. 2024 AD Elster, Elster LLC (Year: 2024).*
International Search Report (PCT/CN2021/074841); Date of Mailing: May 11, 2021.
CN Notice of Allowance(202010243339.X); Date of Mailing: Aug. 31, 2020.
Review on Cerebral White Matter Microstructure Detection Based on Diffusion Magnetic Resonance Imaging.
A simple approach for three-dimensional mapping of baseline cerebrospinal fluid volume fraction.
Diffusion-prepared 3D gradient spin-echo sequence for improved oscillating gradient diffusion MRI.
Oscillating gradient measurements of water diffusion in normal and globally Ischemic rat brain.
Fat-saturated diffusion-weighted imaging of the rat pelvis using three dimensional MP-RAGE MR sequen.
JP First Office Action(JP2022558224); Date of Mailing: Mar. 10, 2023.
MR-imaging some-applications-of-GRASE.
Mapping-water-exchange-across-the-blood-brain-barrier-using-3D-diffusion-prepared-arterial-spin-labeled-perfusion-MRI.
Measuring-human-placental-blood-flow-with-mulMeasuring-human-placental-blood-flow-with-multi-delay-3D-GRASE-pseudo-continuous-arterial-spin-labeling-at-3-Tesla.
Image-Formation-in-Diffusion-MRI-A-Review-of-Recent-Technical-Developments.
T1p-MRI-of-Human-Musculoskeletal-System.
Diffusion-weighted-three-dimensional-MP-RAGE-MR-imaging.

* cited by examiner

3D OSCILLATING GRADIENT-PREPARED GRADIENT SPIN-ECHO IMAGING METHOD, AND DEVICE

CROSS-REFERENCE TO RELATED APPLICATIONS

The present application is a continuation of International Application No. PCT/CN2021/074841, filed on Feb. 2, 2021, which claims priority to Chinese Application No. 202010243339.X, filed on Mar. 31, 2020, the contents of both of which are incorporated herein by reference in their entireties.

TECHNICAL FIELD

The present disclosure relates to the technical field of magnetic resonance and, in particular, to diffusion magnetic resonance imaging.

BACKGROUND

Diffusion MM (dMRI) can detect the microstructure of biological tissues according to the restricted diffusion of water molecules in the microstructural environment. By changing the diffusion encoding, multi-dimensional dMRI signals can be acquired. The signal strength depends not only on the diffusion direction and b value which reflects the strength and timing of the diffusion gradient, but also on the diffusion time and relaxation time. Specifically, the diffusion time determines the sensitivity of dMRI to the microstructural characteristics at different spatial scales. Measuring dMRI signals at different diffusion times can obtain the time dependence of water molecule diffusion, and the time-dependent diffusivity curve reflects important microstructural characteristics, such as cell size, intracellular fraction, surface-area-to-volume ratio. Compared with the traditional pulse gradient dMRI (PG-dMRI) sequence, the use of oscillating gradient dMRI (OG-dMRI) allows a shorter diffusion time (<5 ms), which is important to reconstruct microstructural properties in the short-time regime.

The oscillation gradient is composed of multiple periodic cosine or trapezoidal cosine waveforms, which has been successfully used to study the time-dependent dMRI of animals and water models on animal MRI systems. However, the main challenge of this technique in clinical application is that it needs a strong diffusion gradient. As the b value of the OG waveform is inversely proportional to the cube of its oscillation frequency, the maximum oscillation frequency is limited to 40-60 Hz and the corresponding b value is about 300-500 s/mm$^2$, even if a high-end clinical scanner with a maximum gradient of 80 mT/m is used This leads to limited short diffusion time and low contrast-noise ratio of the signal on clinical scanners. Moreover, OG-dMRI usually takes a long oscillation gradient with multiple periods to achieve a reasonable b value on a clinical scanner, so it takes a long echo time (TE) for image acquisition, which leads to a low signal-to-noise ratio (SNR). In addition, for 2D multislice acquisition, it is necessary to repeatedly apply a strong oscillation gradient to each slice, which will lead to higher duty cycle and system heating. Therefore, OG-dMRI requires a longer repetition time (TR) to reduce the duty cycle and make the acquisition time longer.

SUMMARY

In order to overcome the shortcomings of the existing sequences, the present disclosure proposes a 3D oscillating-gradient prepared gradient spin-echo sequence (OGprep-GRASE) to solve the problems of OG-dMRI sequence mentioned above and improve the performance of diffusion-time-dependent dMRI.

In order to achieve the above purpose, the application adopts the following technical solution:

In a first aspect, the present disclosure provides a method for 3D oscillating-gradient prepared gradient spin-echo imaging, which includes:

S1, adding a global saturation module at the beginning of a sequence to destroy previous residual transverse magnetization, and then waiting for a period of post-saturation delay (PSD) to recover a longitudinal magnetization vector.

S2, adding a diffusion preparation module after post-saturation delay (PSD), and embedding a pair of trapezoidal cosine oscillation gradients or pulse gradients into a $90°_x$-$180°_y$-$90°_{-x}$ radiofrequency pulses to achieve the separation of diffusion encoding from signal acquisition.

S3, adding a fat saturation module after the diffusion preparation module to suppress fat signals.

S4, using a gradient spin-echo sequence module to acquire signals in a 3D k-space after the fat saturation module.

S5, using a multiplexed sensitivity-encoding reconstruction module to correct phase errors among multiple excitations.

Based on the solution of the above first aspect, each step can further provide the following preferred implementation. It should be noted that the technical features in each preferred mode can be combined with each other without conflict. Further, these preferred modes can also be realized by other ways that can achieve the same technical effect, without limitation.

In an embodiment, the global saturation module in step S1 is established as follows:

Applying gradients in X, Y and Z directions simultaneously every time the radiofrequency pulse is applied, which is repeated three times so as to completely eliminate the residual transverse magnetization during last signal acquisition, followed by a period of post-saturation delay (PSD). The PSD is a time interval between the saturation module and the diffusion encoding module.

In an embodiment, the diffusion preparation module in step S2 is established as follows:

Firstly, performing non-slice selective hard pulse excitation with a 90° flip angle along the X-axis direction; then, applying a trapezoidal cosine oscillation gradient along a preset direction of diffusion; then, performing non-slice selective adiabatic tangent pulse with a 180° flip angle along the Y-axis direction, and then applying the same trapezoidal cosine oscillation gradient; then applying a stabilizer gradient ($G_{stb}$) along the Z-axis direction; finally, performing non-slice selective square hard pulse excitation with a 90° flip angle along the X-axis direction to the transverse magnetization into longitudinal magnetization.

In an embodiment, the fat saturation module in step S3 is established as follows:

Applying a frequency-selective Gaussian pulse with a 110° flip angle to flip the) cos (110° part of the longitudinal magnetization of fat to transverse magnetization, and setting the cos (110°) part to 0 after waiting for a duration of T1*ln(2) by applying a gradient in the Z-axis direction at the same time. T1 is a longitudinal relaxation time of the fat.

In an embodiment, the gradient spin-echo sequence module in step S4 is established as follows:

Performing echo plane imaging (EPI) encoding in the Y direction and turbo spin-echo (TSE) encoding in the Z direction to realize 3D GRASE readout; denoting the number of spin-echoes as $N_{SE}$ and the number of gradient echoes as $N_{EPI}$, performing segmented readout in the EPI direction, compulsorily performing central encoding in the TSE direction, and applying a stabilizer gradient in the Z-axis direction before and after each EPI readout.

In an embodiment, the multiplexed sensitivity-encoding reconstruction module in step S5 is established as follows:

Firstly, using the conventional sensitivity encoding (SENSE) technology to estimate phase changes among multiple EPI segments caused by motion, and then jointly calculating amplitude signals of aliased voxels in all interlaced EPIs at the same time.

In a second aspect, the present disclosure provides a device for magnetic resonance imaging, including a magnetic resonance scanner and a control unit. The control unit stores an imaging sequence, and the imaging sequence is configured to realize the method for 3D oscillating-gradient prepared gradient spin-echo imaging according to any one of the previous solutions when executed.

Compared with the prior art, the application has the following characteristics: a 3D oscillating-gradient prepared gradient spin-echo sequence is proposed, and the oscillating gradient diffusion encoding sequence is combined with the gradient spin-echo sequence for the first time. Compared with the conventional 2D-EPI based OG-dMRI sequence, the 3D OGprep-GRASE sequence not only shortens the scan time, but also improves the signal-to-noise ratio. Comparing PG and OG-dMRI imaging results of an adult brain, it indicates that gray matter and white matter of the human brain show obvious diffusion time dependence, no matter whether GRASE or EPI readout sequences are used.

DESCRIPTION OF EMBODIMENTS

Figure 1:
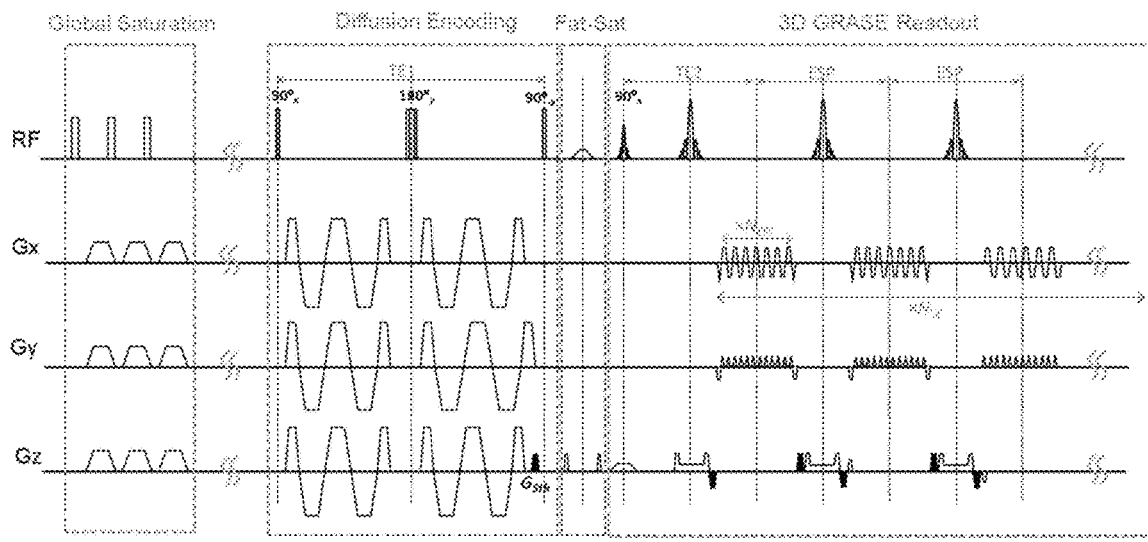
FIG. 1 is a diagram of a 3D OGprep-GRASE sequence.

As shown in FIG. 1 below, the method proposed based on the present disclosure shows the specific technical effect with examples, so that those skilled in the art can understand the essence of the present disclosure better.

Referring to FIG. 1, a 3D oscillating-gradient prepared gradient spin-echo sequence (3D OGprep-GRASE) provided in a preferred embodiment of the present disclosure is shown. The sequence is a novel oscillating gradient diffusion magnetic resonance 3D imaging sequence. The specific method of the sequence will be described in detail below, which includes the follow steps:

Step S1: a global saturation module was added at the beginning of the sequence to destroy the previous residual transverse magnetization. The specific work of the global saturation module was as below: at the beginning of the sequence, a B1 radiofrequency pulse was first applied. Every time a radio frequency pulse was applied, gradients were applied in the three directions of X, Y and Z at the same time, and the amplitudes of the three gradients were completely equal. After three radiofrequency pulses were applied, it could be considered that the transverse magnetization left in the last signal acquisition had been completely eliminated. After that, a period of time called post-saturation delay (PSD) was waited for the recovery of the longitudinal magnetization vector. In the application, the time interval between the saturation module and the diffusion encoding module is recorded as PSD.

Step S2: immediately after the PSD, the diffusion preparation module embedded a pair of trapezoidal cosine oscillation gradients or pulse gradients into a $90°_x$-$180°_y$-$90°_{-x}$ radiofrequency pulse to achieve the separation of diffusion encoding from signal acquisition. The specific work of the diffusion preparation module was as follows: firstly, non-slice selective hard pulse excitation with a 90° flip angle was emitted along the X axis direction; then, a trapezoidal cosine oscillation gradient was applied along the diffusion direction, and the magnitude of the gradient was related to the set b value; then, due to the insensitivity of the adiabatic tangent pulse to the B1 field, the adiabatic tangent pulse excitation with a 180° flip angle performed along the Y-axis direction, and the scattered transverse magnetization were reunited; then, a trapezoidal cosine oscillation gradient with the same amplitude, shape, duration and the like as previously applied was applied; next, a stabilizer gradient (Gstb) was applied in the Z-axis direction to alleviate the signal modulation related to the phase error, and the gradient amplitude was set to the same amplitude as the crusher gradient in the GRASE readout module. Finally, non-slice selective hard pulse excitation with a 90° flip angle was emitted along the X-axis direction, and the reunited transverse magnetization were converted into longitudinal magnetization vectors. The echo time in the diffusion preparation module is denoted as TE1.

Step S3: a fat saturation module was added after the diffusion preparation module to suppress the fat signals. The specific work of the fat saturation module was as follows: a frequency selective Gaussian pulse with a 110° flip angle was applied, the cos (110°) part of the longitudinal magnetization of fat was flipped to transverse magnetization, after waiting for a duration of T1*ln(2), the imaging model of step S4 was applied when the magnetization vector recovered after flipping was 0, and simultaneously the gradient in the Z axis direction was applied.

Step S4: after the fat saturation module, the gradient spin-echo sequence module was configured to acquire signals in 3D k-space. The specific method of the gradient spin-echo sequence module was: 3D GRASE readout was realized by encoding the echo plane imaging (EPI) in the Y direction and the turbo spin-echo (TSE) in the Z direction. The number of phase codes in the EPI direction is denoted as $N_{EPI}$. The number of phase codes in the TSE direction is denoted as $N_{SE}$. That is, the number of spin-echoes is $N_{SE}$ and the number of gradient echoes is $N_{EPI}$. Segmented readout can be performed along the EPI direction. This segmented readout was the whole or segmented acquisition of NEPI along the EPI direction, and the center encoding was enforced along the TSE direction. That is, the k-space center was filled in the kz direction in manner of the EPI readout signals after the first focusing pulse. The stabilizer gradient was applied along the Z-axis direction before and after each EPI readout and simultaneously with the crusher gradient beside the refocusing pulse. The echo time in the GRASE module is expressed as TE2, which was equal to the echo interval (ESP) for subsequent signal acquisition in the TSE mode. Therefore, the total echo time of the acquired signal was TE1+TE2.

When the phase code of the EPI direction is divided into N segments for signal acquisition, the signal acquisition of each segment needs to be repeated from step S1 to step S4, so that compared with the conventional acquisition mode, the $N_{EPI}$ of the segmented acquisition mode is reduced, each readout time is shorter, and the signal attenuation is smaller, which can improve the image resolution and reduce the deformation effect of EPI. However, the acquisition time becomes N times of the original one, and motion-sensitive at the same time, so the motion error between each segment needs to be corrected. However, the signal-to-noise ratio of the image is greatly improved.

Step S5: a MUSE-based motion correction module was configured to correct the phase error between multiple excitations. That is, in step S4, if segmented signals were used for acquisition along the EPI direction, MUSE-based motion correction would be needed to correct the motion error between each segment of the acquired signals. In MUSE-based motion correction, the conventional sensitivity encoding (SENSE) technique was used to estimate the phase changes among multiple EPI segments caused by motion, and then the amplitude signals of aliased voxels were jointly calculated in all interlaced EPIs at the same time. Compared with the conventional SENSE method, the MUSE method greatly improves the condition of matrix inversion, so images with a higher signal-to-noise ratio can be obtained.

It can be seen that the 3D OGprep-GRASE sequence in the present disclosure not only shortens the scan time of the image but also improves the signal-to-noise ratio. In order to further demonstrate the effect of this method, the application also carried out the following steps.

Step S6: after the processing in steps S1 to S5, post-processing was carried out to obtain the quantitative indexes of DTI: apparent diffusion coefficient (ADC), fractional anisotropy (FA), and diffusion direction-encoded colormap (DEC). The post-processing method was as follows: the obtained images with different b values was taken out along the three directions of X, Y and Z, the diffusion values Dxx, Dyy and Dzz of each pixel of the image in the three directions of X, Y and Z were calculated, respectively, and the ADC value was obtained by averaging the three values. The general formula for calculating the diffusion value D in any direction is:

$$D=-\ln(S2/S1)/(b2-b1)$$

where S1 and S2 are image pixel values at two different b values respectively in the current calculation direction.

In addition, according to the calculation formula of the diffusion, the D values of six directions (the subscript of D indicates the direction) can be obtained, and the D values of six directions can be constructed into a matrix D:

$$D = \begin{bmatrix} D_{xx} & D_{xy} & D_{xz} \\ D_{xy} & D_{yy} & D_{yz} \\ D_{xz} & D_{yz} & D_{zz} \end{bmatrix}$$

By calculating three eigenvectors and three eigenvalues $\lambda_2$, $\lambda_2$, $\lambda_3$ of the matrix D, the FA value of each voxel in the image is obtained by the following formula:

$$FA = \sqrt{\frac{1}{2}} \frac{\sqrt{(\lambda_1-\lambda_2)^2+(\lambda_2-\lambda_3)^2+(\lambda_3-\lambda_1)^2}}{\sqrt{\lambda_1^2+\lambda_2^2+\lambda_3^2}}$$

The eigenvector corresponding to the largest eigenvalue $\lambda$ in the three eigenvalues is taken as the main direction of the diffusion, and the diffusion direction encoded color map is drawn according to the different directions of three-dimensional space.

The technical effects will be demonstrated below with reference to examples based on steps one to six of the above method, so that those skilled in the art can better understand the essence of the present disclosure.

EXAMPLES

The 3D oscillating-gradient prepared gradient spin-echo sequence method mentioned above was tested in 7 healthy young male volunteers. Here are the specific parameters: Siemens Prisma 3.0T scanner was used for nuclear magnetic resonance scanning, and all scans were performed with a 64-channel head coil at the maximum gradient of 80 mT/m. Two groups of experiments were conducted in this example.

Experiment 1: In order to compare the scan time and image signal-to-noise ratio of 3D OGprep-GRASE and 2D OG-EPI sequences, OG-dMRI scanning was performed with a 50 Hz oscillation gradient, b=500 s/mm², 12 directions, 2 repetitions, FOV=220×220 mm, a resolution of 2.75×2.75 mm², a slice thickness of 3 mm (2.75×2.75×3 mm³ in 3D GRASE). The following solution was adopted.

(1) A GRASE readout sequence with single excitation, $N_{EPI}$=80, $N_{SE}$=10, turbo factor=12, EPI factor=63, slice oversampling=20%, partial Fourier factor=61%, bandwidth=2,500 Hz, TE1/TE2/TR=124/33.6/3000 ms; the corresponding 2D-EPI readout sequence scanned 10 slices, with a partial Fourier factor=6/8, a bandwidth=1,690 Hz, TE/TR=158/4200 ms (minimum TR), and a scanning time=2.0 min.

(2) A GRASE readout sequence with two excitations, $N_{EPI}$=80, $N_{SE}$=20, turbo factor=24, EPI factor=27, TE1/TE2/TR=124/22.9/3000 ms, scanning time=2.9 min; other parameters were consistent with those of the GRASE readout sequence of one excitation; the corresponding 2D-EPI readout sequence scanned 20 slices, with a partial Fourier factor=6/8, TE/TR=147/8400 ms (minimum TR), and a scanning time=4.0 min. Other parameters were the same as those of the 2D-EPI corresponding to single excitation.

(3) The GRASE readout sequence with three excitations, $N_{EPI}$=80, $N_{SE}$=30, turbo factor=36, EPI factor=21, TE1/TE2/TR=124/20.2/3000 ms, scanning time=4.3 min; other parameters were consistent with those of the GRASE readout sequence with single excitation; the corresponding 2D-EPI readout sequence scanned 20 slices, with a partial Fourier factor=6/8, TE/TR=144/12600 ms (minimum TR), scanning time=6.0 min, and other parameters were the same as those of 2D-EPI corresponding to single excitation.

Experiment 2: In order to test the reliability of the sequence in the present disclosure in measuring diffusion coefficients at different diffusion times, the OGprep-GRASE sequence with single excitation was implemented at oscillation frequencies of 25 Hz and 50 Hz, b=600 s/mm², 6 directions, TE1/TE2/TR=84/32/3000 ms, a matrix size=80× 80×10, an imaging resolution=2.75×2.75×5 mm; a PGprep-GRASE sequence, δ=20 ms, Δ=30 and 60 ms, and other parameters were consistent with those of the OGprep sequence. As a comparison, 2D EPI data were also acquired with oscillation gradients of 25 Hz and 50 Hz and pulse gradients of δ=20 ms, Δ=30/60 ms, and other parameters consistent with the prep-GRASE scanning. Finally, PG-dMRI and OG-dMRI with two excitations in a group of subjects were acquired to test the effectiveness of the multiple sensitivity encoding MUSE-based motion correction algorithm in motion artifact correction.

Figure 2:
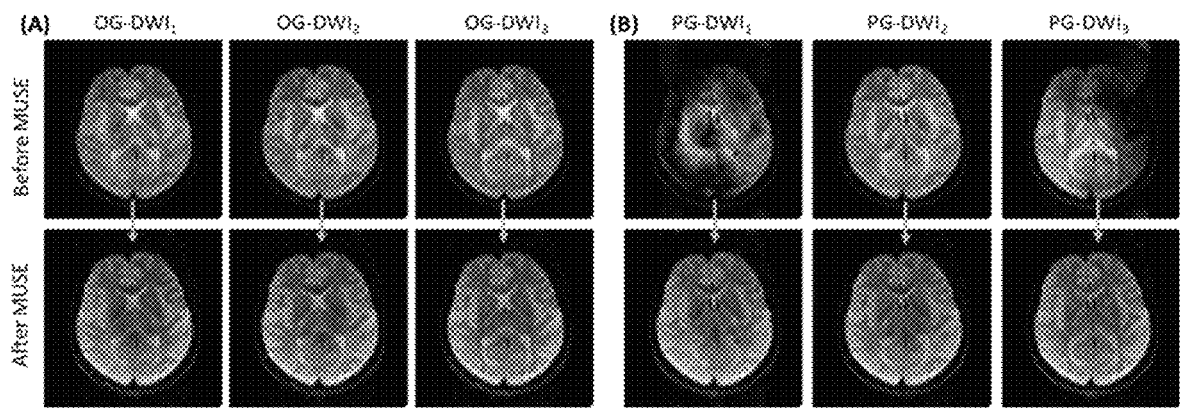
FIG. 2 is a comparison of the reconstructed image before and after MUSE-based motion correction using OGprep-GRASE and PGprep-GRASE sequences, respectively.

FIG. 2 shows the images acquired by OG- and PG-prepared GRASE sequences before and after MUSE-based motion correction. It can be seen from the figure that for the GRASE acquisition mode with two excitations, the motion artifact is not obvious in the OG-dMRI image, but obvious in the PG-dMRI image, and MUSE can correct the phase error caused by motion to a great extent.

Figure 3:
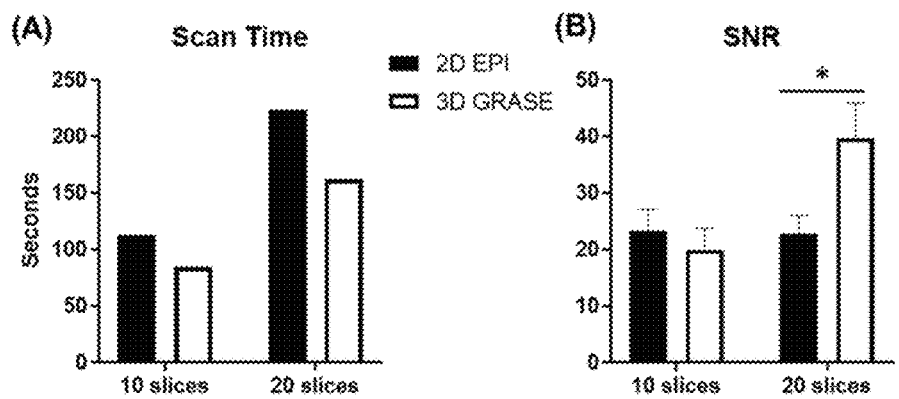
FIG. 3 is a comparison result of the scan time and signal-to-noise ratio of OG-dMRI using 2D EPI and 3D GRASE readout sequences, respectively.

FIG. 3 shows that the scanning speed of 3D OGprep-GRASE is increased by 1.34 and 1.38 times, respectively, compared with 2D EPI sequence, for the 10-slice and 20-slice acquisition protocols in Experiment 1. For the 10-slice protocol, GRASE and EPI sequences show similar image signal-to-noise ratio, but for 3D GRASE sequences, when the number of slices increases to 20, the image signal-to-noise ratio the doubles, while the image signal-to-noise ratio of the 2D EPI data remains unchanged.

Figure 4:
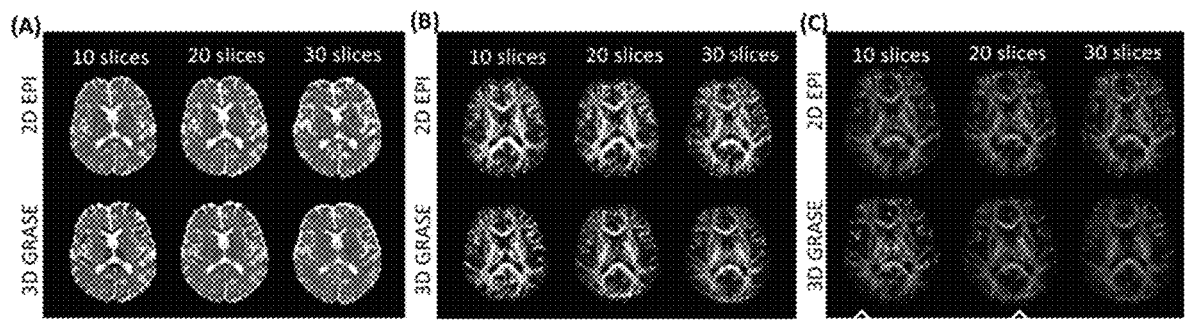
FIG. 4 is a comparison of tensor-based quantitative maps from OG-dMRI using 2D EPI and 3D GRASE readout sequences: an apparent diffusion coefficient map, a fraction anisotropic map and a diffusion direction-encoded colormap.

FIG. 4 shows a comparison of the index apparent diffusion system (ADC), anisotropy (FA) and direction encoded color map (DEC) of OG-dMRI obtained by using the readout data of 2D EPI and 3D GRASE respectively after diffusion tensor reconstruction. It can be seen from the image that noise points can be observed in 2D EPI data of 10-, 20- and 30-slice protocols. In 10-slice 3D GRASE data, the noise is similar to EPI data, but as the number of slices increases to 20 and 30, the image gradually becomes clear. It shows that the 3D GRASE readout sequence acquires images with a high signal-to-noise ratio.

Figure 5:
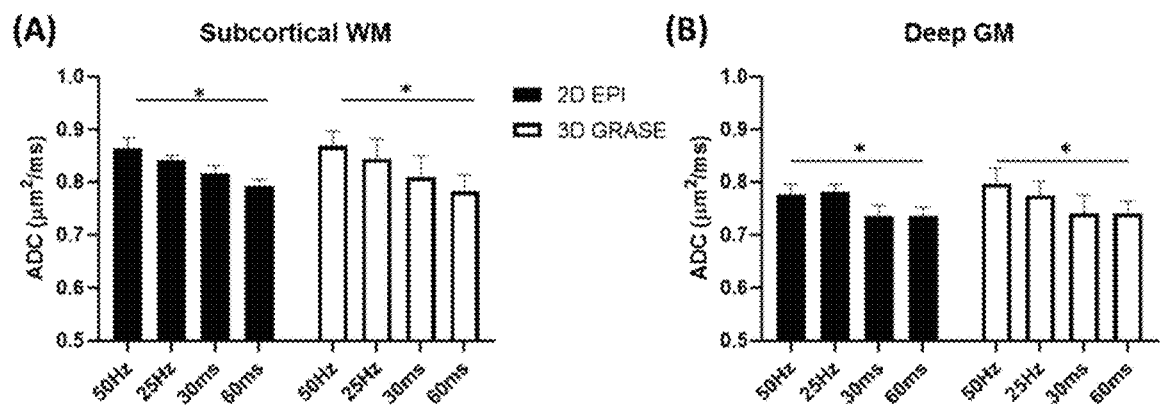
FIG. 5 shows the diffusion time dependence of OG-dMRI obtained by using 2D EPI and 3D GRASE readout sequences, respectively.

In the images obtained from imaging of 3D GRASE and 2D EPI sequences of OG-dMRI (50 Hz and 25 Hz) and PG-dMRI (30 ms and 60 ms), ADC data in subcortical white matter and deep gray matter of a human brain were obtained, respectively. As shown in FIG. 5, ADC values from the two sequences show significant time dependence in white matter and gray matter ($p<0.0001$), and no significant sequence difference is found through two-way ANOVA test, indicating that 3D OGprep-GRASE sequence can effectively measure the time dependence of ADC, and the result is consistent with that of the ordinary 2D EPI sequence.

Therefore, compared with the oscillating gradient diffusion sequence based on 2D plane echo used in the 3T clinical system, the 3D OGprep-GRASE sequence of the present disclosure effectively improves the imaging time and signal-to-noise ratio, and contributes to the clinical transformation of time-dependent diffusion MM technology.

Based on the above 3D OGprep-GRASE sequence, in other embodiments, a device for magnetic resonance imaging may be further provided, which includes a magnetic resonance scanner and a control unit. An imaging sequence, namely the 3D OGprep-GRASE sequence, is stored in the control unit. This imaging sequence, when executed, is configured to realize the 3D oscillation-gradient prepared gradient spin-echo imaging method in the previous steps one to five.

It should be noted that the hardware structure of the magnetic resonance scanner and the control unit here can be realized by a conventional magnetic resonance imaging system. The magnetic resonance scanner should include a magnet part and a magnetic resonance spectrometer part. The control unit should contain the necessary data processing and image reconstruction software for imaging. The 3D OGprep-GRASE sequence can be read by the control unit and used to control the magnetic resonance scanner. That is, the 3D OGprep-GRASE sequence can be directly applied to the corresponding device for magnetic resonance imaging.

It should be pointed out that the above examples are only preferred solutions of the present disclosure, but they are not intended to limit the present disclosure. Those skilled in the art can make various changes and modifications without departing from the spirit and scope of the present disclosure. Therefore, all technical solutions obtained by equivalent substitution or equivalent transformation fall within the scope of protection of the present disclosure.

What is claimed is:

1. A method for 3D oscillating-gradient prepared gradient and spin-echo imaging, comprising following steps:
   S1, adding a global saturation module at a beginning of a sequence to destroy previous residual transverse magnetization, and waiting for a period of post-saturation delay (PSD) to recover a longitudinal magnetization;
   S2, adding a diffusion preparation module after post-saturation delay (PSD), and embedding a pair of trapezoidal cosine oscillation gradients or pulse gradients into $90°_x$-$180°_y$-$90°_{-x}$ radiofrequency pulses to realize separation of diffusion encoding from signal acquisition;
   S3, adding a fat saturation module after the diffusion preparation module to suppress a fat signal;
   S4, acquiring signals in a 3D k-space through a gradient and spin-echo sequence module after the fat saturation module; and
   S5, correcting phase errors among multiple excitations with a multiplexed sensitivity-encoding reconstruction module;
   wherein the diffusion preparation module in step S2 is established as follows:
   firstly, performing non-slice selective hard pulse excitation with a 90° flip angle along the X-axis direction,
   then, applying a trapezoidal cosine oscillation gradient along a preset direction of diffusion,
   then, performing non-slice selective adiabatic tangent pulse with a 180° flip angle along the Y-axis direction,
   then, applying a same trapezoidal cosine oscillation gradient along the Y-axis direction,
   then applying a stabilizer gradient ($G_{stb}$) along the Z-axis direction, and
   finally, performing non-slice selective square hard pulse excitation with a 90° flip angle along the negative X-axis direction, and converting a transverse magnetization into the longitudinal magnetization.

2. The method for 3D oscillating-gradient prepared gradient and spin-echo imaging according to claim 1, wherein the global saturation module in step S1 is established as follows:
   at the beginning of the sequence, first applying a B1 radiofrequency pulse, applying gradients in X-axis, Y-axis and Z-axis directions simultaneously every time the B1 radiofrequency pulse is applied, which is repeated three times, so as to completely eliminate the previous residual transverse magnetization during last signal acquisition followed by the period of post-saturation delay (PSD),
   wherein the post-saturation delay (PSD) is a time interval between the global saturation module and the diffusion preparation module.

3. The method for 3D oscillating-gradient prepared gradient and spin-echo imaging according to claim 1, wherein the fat saturation module in step S3 is established as follows:

applying a frequency-selective Gaussian pulse with a 110° flip angle, flipping a cos (110°) part of a longitudinal magnetization of fat, and setting the cos (110°) part to 0 after waiting for a duration of T1*ln(2), and applying a gradient in the Z-axis direction at a same time, wherein T1 is a longitudinal relaxation time of the fat.

4. The method for 3D oscillating-gradient prepared gradient and spin-echo imaging according to claim 1, wherein the gradient and spin-echo sequence module in step S4 is established as follows:

performing echo plane imaging (EPI) encoding in the Y-axis direction and turbo spin-echo (TSE) encoding in the Z-axis direction to realize 3D GRASE readout, performing segmented readout in the EPI direction, compulsorily performing central encoding in the TSE direction; and applying a stabilizer gradient in the Z-axis direction before and after each segmented readout in the EPI direction, wherein a number of spin-echoes is denoted as $N_{SE}$ and a number of gradient echoes is denoted as $N_{EPI}$.

5. The method for 3D oscillating-gradient prepared gradient and spin-echo imaging according to claim 1, wherein the multiplexed sensitivity-encoding reconstruction module in step S5 is established as follows:

firstly, estimating phase changes among multiple EPI segments caused by motion by conventional sensitivity encoding (SENSE) technology, and then, jointly calculating amplitude signals of aliased voxels in all interlaced EPIs at a same time.

6. A device for magnetic resonance imaging, comprising a magnetic resonance scanner and a control unit, wherein the control unit stores an imaging sequence, and the imaging sequence, when executed, is configured to realize the method for 3D oscillating-gradient prepared gradient and spin-echo imaging according to claim 1.

* * * * *